(12) United States Patent  
Takeda

(10) Patent No.: US 6,665,204 B2  
(45) Date of Patent: Dec. 16, 2003

(54) SEMICONDUCTOR MEMORY DEVICE FOR DECREASING A COUPLING CAPACITANCE

(75) Inventor: Koichi Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/772,964

(22) Filed: Jan. 31, 2001

(65) Prior Publication Data

US 2001/0011735 A1 Aug. 9, 2001

(30) Foreign Application Priority Data

Feb. 4, 2000 (JP) .................................... P2000-028078

(51) Int. Cl.$^7$ ................................................ G11C 5/06
(52) U.S. Cl. .......................................... 365/63; 365/69
(58) Field of Search ...................................... 365/63, 69

(56) References Cited

U.S. PATENT DOCUMENTS

| | | | | |
|---|---|---|---|---|
| 5,062,077 A | * | 10/1991 | Takashima et al. | ........... 365/69 |
| 5,136,543 A | * | 8/1992 | Matsuda et al. | ............ 365/190 |
| 5,732,010 A | * | 3/1998 | Takashima et al. | ........... 365/63 |
| 5,886,919 A | * | 3/1999 | Morikawa et al. | ............. 365/69 |
| 5,973,983 A | * | 10/1999 | Hidaka | .................. 365/230.03 |

FOREIGN PATENT DOCUMENTS

| | | | | |
|---|---|---|---|---|
| JP | 3-072674 | | 3/1991 | |
| JP | 4-208566 A | * | 7/1992 | ......... H01L/27/115 |
| JP | 5-89664 A | * | 4/1993 | ......... G11C/11/401 |
| JP | 5-325542 | | 12/1993 | |
| JP | 7-235184 | | 9/1995 | |
| JP | 8-221974 | | 8/1996 | |
| JP | 10-308460 | | 11/1998 | |

* cited by examiner

*Primary Examiner*—M. Tran  
(74) *Attorney, Agent, or Firm*—Foley & Lardner

(57) ABSTRACT

The semiconductor memory device of the present invention comprises: memory cells arranged in a matrix; word lines extending in a row direction; bit line pairs extending in a column direction; exchange blocks for exchanging the bit lines of the different neighboring bit line pairs.

20 Claims, 8 Drawing Sheets

FIG. 4

| ADDRESS | | | | SELECTION LINE | | | | | | | |
|---|---|---|---|---|---|---|---|---|---|---|---|
| X1 | X0 | Y1 | Y0 | S1 | SB1 | SB2 | S2 | S3 | SB3 | SB4 | S4 |
| 0 | 0 | 0 | 0 | 0 | 0 | 1 | 1 | 1 | 1 | 1 | 1 |
| 0 | 0 | 0 | 1 | 1 | 1 | 0 | 0 | 1 | 1 | 1 | 1 |
| 0 | 0 | 1 | 0 | 1 | 1 | 1 | 1 | 0 | 0 | 1 | 1 |
| 0 | 0 | 1 | 1 | 1 | 1 | 1 | 1 | 1 | 1 | 0 | 0 |
| 0 | 1 | 0 | 0 | 1 | 0 | 1 | 0 | 1 | 1 | 1 | 1 |
| 0 | 1 | 0 | 1 | 0 | 1 | 1 | 1 | 1 | 0 | 1 | 1 |
| 0 | 1 | 1 | 0 | 1 | 1 | 0 | 1 | 1 | 1 | 1 | 0 |
| 0 | 1 | 1 | 1 | 1 | 1 | 1 | 1 | 0 | 1 | 0 | 1 |
| 1 | 0 | 0 | 0 | 1 | 1 | 1 | 0 | 1 | 0 | 1 | 1 |
| 1 | 0 | 0 | 1 | 1 | 0 | 1 | 1 | 1 | 1 | 1 | 0 |
| 1 | 0 | 1 | 0 | 0 | 1 | 1 | 1 | 1 | 1 | 0 | 1 |
| 1 | 0 | 1 | 1 | 1 | 1 | 0 | 1 | 0 | 1 | 1 | 1 |
| 1 | 1 | 0 | 0 | 1 | 1 | 1 | 1 | 0 | 1 | 0 | 1 |
| 1 | 1 | 0 | 1 | 1 | 1 | 1 | 0 | 1 | 1 | 0 | 1 |
| 1 | 1 | 1 | 0 | 1 | 0 | 1 | 1 | 0 | 1 | 1 | 1 |
| 1 | 1 | 1 | 1 | 0 | 1 | 0 | 1 | 1 | 1 | 1 | 1 |

R

SEMICONDUCTOR MEMORY DEVICE FOR DECREASING A COUPLING CAPACITANCE

BACKGROUND OF THE INVENTION

1. Field of the Invention

The present invention relates to a semiconductor memory device which allows non-destructive reading, and in particular, to a semiconductor memory device which can decrease the total coupling capacitance between the bit lines, and which can accelerate the operation for reading data.

2. Description of the Related Art

As micro-processing technology develops, the pitch width between the bit lines used to read or write data in a semiconductor memory device is decreased. Therefore, the coupling capacitance between the bit lines is increased as the memory cell area becomes small.

To explain the coupling capacitance, the arrangement of the bit lines in a conventional static random access memory (SRAM) will be discussed with reference to FIG. 7. FIG. 7 is a schematic diagram showing the arrangement of the bit lines and memory cells in a conventional semiconductor device.

For example, since a bit line BB1 neighbors bit lines BB0 and BB2, a coupling capacitance C10 is produced between the bit lines BB1 and BB0, and a coupling capacitance C12 is produced between the bit lines BB1 and BB0.

When both of the coupling capacitances C10 and C12 produced by the bit lines BB0 and BB2 is Cc, the total coupling capacitance CT between the bit line BB1 and the neighboring bit lines is 2×Cc based on the coupling capacitances C10 and C12 with the bit lines BB0 and BB2.

When the data output from a memory cell 100 in the SRAM to the bit line BB1 is the same as the data output from a memory cell 101 to the bit line BB2, the variations in electric potentials in the bit lines BB1 and BB2 are the same. Therefore, the coupling capacitance C12 between the bit lines BB1 and BB2 is estimated to be zero.

Under these conditions, which are the best conditions, the total coupling capacitance CT is reduced, the total coupling capacitance CT of the bit line BB1 is Cc based on the coupling capacitance C10 with the bit line BB0.

The worst condition to increase the total capacitance CT is that the data output from the memory cell 100 to the bit line BB1 is different from the data output from the memory cell 101 to the bit lines BB2. In this situation, variations in the electric potential in the bit lines BB1 and BB2 differ from each other.

In the worst condition, the total capacitance CT of the bit line BB1 is 2×Cc based on the coupling capacitances C10 and C12 with the bit lines BB0 and BB2.

As described above, when reading data from the SRAM, the access time may significantly differ, depending on the data output to the neighboring bit lines.

The actual access time when using the SRAM may be the above-described access time in the worst condition.

The total coupling capacitances between the bit lines may be averaged so that noise due to changes (loss) in data can be decreased when the data from the neighboring bit lines differ from each other. Thus, the access times under the best and worst conditions can be averaged, and the total access time can be shortened.

For the above-described reason, the twist bit line structure shown in FIG. 8 for decreasing the total coupling capacitance between the neighboring bit lines has been proposed. The twist bit line structure will be explained with reference to FIG. 7. FIG. 8 is a schematic diagram showing the arrangement of the twist bit lines and the memory cells in another conventional semiconductor device.

The memory cell array (memory cell area) 500 is divided into four blocks 501, 502, 503, and 504 having the same number of the memory cells (or the same number of word lines) in the direction of the bit lines (from the top to the bottom of the figure).

Blocks 251 are inserted between the first block 501 and the second block 502, and between the third block 503 and the fourth block 504. The blocks 251 exchange the bit line 221 with the bit line 222, and exchange the bit line 225 with the bit line 226. The bit lines 221 and 222 constitute a bit line pair, and the bit lines 225 and 226 constitute another bit line pair.

Similarly, a block 252 is inserted between the second block 502 and the third block 503. The block 252 exchanges the bit line 223 with the bit line 224, and exchanges the bit line 227 with the bit line 228. The bit lines 223 and 224 constitute a bit line pair, and the bit lines 227 and 228 constitute another bit line pair.

That is, the blocks 251 and 252 exchange the bit lines constituting bit line pairs.

As the result, in the arrangement of the bit lines in the SRAM shown in FIG. 8, there are five bit lines neighboring the bit line 224 which produce the coupling capacitances. That is, the bit line 224 neighbors the bit line 223 whish is one of the bit line pair, the bit lines 221 and 222 which constitute the bit line pair, and the bit lines 225 and 226 which constitute the other bit line pair.

Although the bit line 223 neighbors the bit line 224 in all the blocks 501 to 504, the bit line 223 neighbors the bit line 22 only in the block 501. Similarly, the bit line 223 neighbors the bit line 221 only in the block 502, neighbors the bit line 226 only in the block 503, and neighbors the bit line 225 only in the block 504.

That is, the bit line 223 neighbors one of the bit lines 221, 222, 225, and 226 in one of the blocks 501 to 504.

Whatever the memory cells 211, 212, and 213 output to the bit lines, the best and worst conditions for the read operation are averaged so that the total coupling capacitance of the bit line 223 can be equivalent to 3/2×Cc.

Because the bit line 223 always neighbors the bit line 224 which is one of the bit line pair, the coupling capacitance C34 between the bit lines 223 and 224 is always Cc.

Further, because the bit line 223 neighbors one of the bit lines 221, 222, 225, and 226 in one of the blocks 501 to 504, the capacitance value of zero under the best conditions and the capacitance value Cc under the worst conditions can be averaged.

Accordingly, the coupling capacitance between the bit line 223 and the bit lines 221, 222, 225, and 226 is 1/2×Cc.

The total coupling capacitance of the bit line 223 is 3/2×Cc regardless of the electric potentials of the data output from the memory cells 211 to 213 to the bit lines when reading the data.

As a result, as compared with the total coupling capacitance CT of 2×Cc under the worst conditions in the conventional bit line arrangement shown in FIG. 7, the bit line arrangement shown in FIG. 8 decreases the total coupling capacitances of the bit lines regardless of the electric potentials of the data output to the bit lines, thereby improving the access time to read the data.

However, in the twist bit line arrangement shown in FIG. 8, two bit lines constituting the bit line pair always neighbor each other. The two bit lines are complementary, and therefore always output different data. Therefore, the coupling capacitance Cc due to the worst conditions of the variation in the electric potentials is always present between the two bit lines constituting the bit line pair.

As described above, the conventional twist bit line arrangement in the conventional SRAM cannot decrease the total coupling capacitance between the bit lines to less than 3/2×Cc.

BRIEF SUMMARY OF THE INVENTION

It is therefore an object of the present invention to provide a semiconductor memory device which can decrease the total coupling capacitance between the bit lines below 3/2×Cc, and which can accelerate the operation for reading data.

In the first aspect of the present invention, the semiconductor memory device comprises: memory cells arranged in a matrix; word lines extending in a row direction; bit line pairs extending in a column direction; exchange blocks for exchanging the bit lines of the different neighboring bit line pairs.

In the second aspect of the present invention, the semiconductor memory device according to claim 1 further comprises: memory cell blocks each of which has a predetermined number of the memory cells, and which are aligned in the column direction. The respective exchange blocks are positioned between the memory cell blocks.

In the third aspect of the present invention, first exchange blocks exchange the bit lines of the different neighboring bit line pairs, and second exchange blocks exchange the bit lines constituting the same bit line pairs. The first and second exchange blocks are arranged alternately.

In the fourth aspect of the present invention, the memory cells are divided into a plurality of memory cell blocks, the exchange blocks exchange the positions of the bit lines in the respective memory cell blocks so that each bit line neighbors the other bit lines only once in one of the memory cell blocks.

In the fifth aspect of the present invention, the semiconductor memory device further comprises: a first connection layer for forming the bit lines; and a second connection layer for exchanging the bit lines at the exchange blocks.

In the sixth aspect of the present invention, each bit line layer crosses one bit line at the exchange block.

In the seventh aspect of the present invention, each bit line layer crosses two bit line at the exchange block.

In the eighth aspect of the present invention, the respective bit line pairs are formed in the same connection layer outside the exchange blocks.

In the ninth aspect of the present invention, the respective bit line pairs are formed in a plurality of connection layers outside the exchange blocks.

A memory cell array is divided into the memory cell blocks, and the exchange blocks for exchanging the positions of the bit lines of the bit line pairs are inserted between the memory cell blocks, and exchange the positions of the bit lines of the same bit line pair and of different neighboring bit line pairs. Thus, the bit lines equally neighbors all the other bit lines. Therefore, regardless of the data values read from the memory cells to the bit line pairs, the total coupling capacitance between the neighboring bit lines is the average between the total coupling capacitance in the best data conditions of the neighboring bit lines and the total coupling capacitance in the worst condition, decreasing the cross-talk noise in the bit lines, and shortening the access time in the reading operation.

For example, when there are four bit line pairs, the total coupling capacitance CT with the neighboring bit lines is obtained by adding the coupling capacitance 1/4×Cc with the bit line constituting the bit line pair, the coupling capacitance 3/4×Cc with the bit lines which do not constitute the bit line pair, and the coupling capacitance 1/4×Cc with a bit line in another memory cell array, that is, 5/4×Cc.

The total coupling capacitance of the bit line and the neighboring bit lines is 5/4×Cc. As compared with the coupling capacitance 3/2×Cc between the bit lines in the conventional twist bit line method, the loads on the bit lines are significantly decreased. Therefore, the effect of cross talk noise between the neighboring bit lines can be reduced, and the access time for reading data from the memory cells can be shortened.

When the memory cell array has N bit line pairs, the coupling capacitance of each of the neighboring bit lines is ((N+1)/N)×Cc. As the number N of the bit line pairs is increased, and the total coupling capacitance of each of the neighboring bit lines can be brought close to Cc.

The total coupling capacitance between the neighboring bit lines is the average between the total coupling capacitance under the best data conditions of the neighboring bit lines and the total coupling capacitance under the worst condition, dispersing the effect of the cross-talk noise over the bit lines. Accordingly, the reading speeds are averaged between the bit line pairs, shortening the access time in the reading operation.

BRIEF DESCRIPTION OF THE DRAWINGS

FIG. 4 is a truth table used in the decoding process by the Y decoders of the present invention.

DETAILED DESCRIPTION OF THE INVENTION

Figure 1:
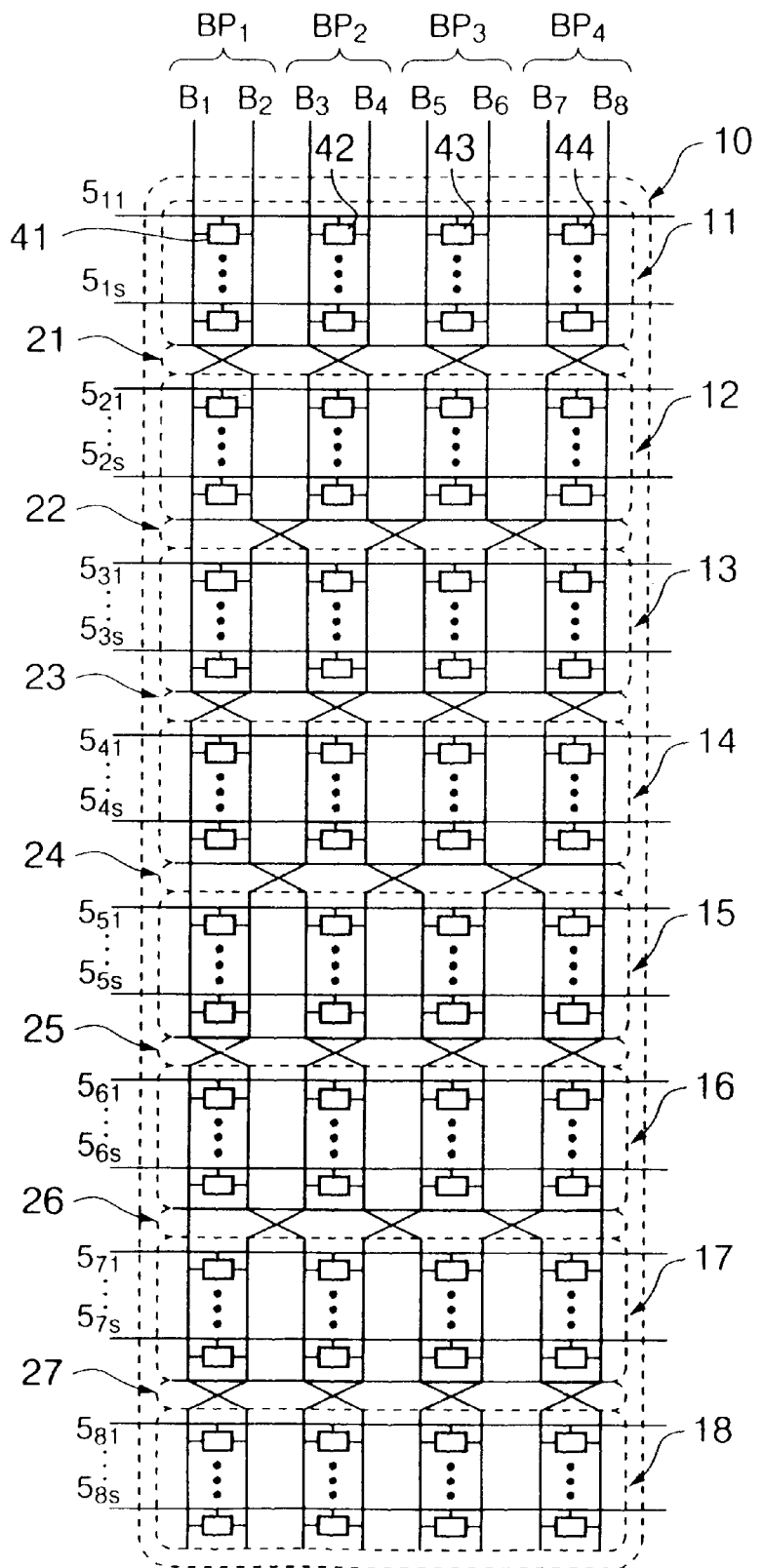
FIG. 1 is a schematic diagram showing the arrangement of the bit lines and memory cells in the first embodiment of the present invention.

An embodiment of the present invention will be explained with reference to figures. FIG. 1 is a schematic diagram showing the arrangement of bit lines and memory cells in an SRAM of the embodiment of the present invention. In FIG. 1, the memory cell 10 comprises a memory cell array of the memory cells 41 connected to a bit line pair BP1, a memory cell array of the memory cells 42 connected to a bit line pair BP2, a memory cell array of the memory cells 43 connected to a bit line pair BP3, and a memory cell array of the memory cells 44 connected to a bit line pair BP4.

In memory cell blocks 11 and 12, the bit line pair BP1 comprises bit lines B1 and B2, the bit line pair BP2 comprises bit lines B3 and B4, the bit line pair BP3 comprises bit lines B5 and B6, and the bit line pair BP4 comprises bit lines B7 and B8.

In memory cell blocks 13 and 14, the bit line pair BP1 comprises bit lines B2 and B4, the bit line pair BP2 comprises bit lines B1 and B6, the bit line pair BP3 comprises bit lines B3 and B8, and the bit line pair BP4 comprises bit lines B5 and B7.

Thus, the memory cell blocks have different combinations of the bit lines constituting the bit line pairs.

The memory cell array 10 is divided into eight memory cell blocks 11 to 18 which align in the direction of the bit line pairs. In each memory cell block, for example, in each memory cell in the memory cell block 11, word lines 51*l* to 51*s* extending in the row direction are connected to the memory cells (s is integer). The word line 511 is connected to the memory cells 41 to 44.

In the semiconductor memory device of the present invention, the bit lines change their positions between the bit line pairs (BP1 to BP4) to which four memory cell arrays are connected.

In the memory cell blocks 11 to 18 into which the memory cell array 10 divided, the eight bit lines B1 to B8 change their positions as follows.

Exchange blocks for exchanging the electrical connections of the bit lines are inserted between memory cell blocks 11 and 12, 13 and 14, 15 and 16, and 17 and 18, and between the first (from the left of FIG. 1) and second bit lines, the third and fourth bit lines, the fifth and sixth bit lines, the seventh and eighth bit lines.

For example, in the block 21 between the memory cell blocks 11 and 12, the bit lines B1 and B2 exchange their positions, the bit lines B3 and B4 exchange their positions, the bit lines B5 and B6 exchange their positions, and the bit lines B7 and B8 exchange their positions.

That is, the block 21 exchanges the positions of the bit lines constituting the bit line pairs. The other blocks 23, 25, and 27 are inserted between the memory cell blocks 13 and 14, 15 and 16, and 17 and 18, and have the structures similar to that of the block 21.

Similarly, exchange blocks for exchanging the electrical connections of the bit lines are inserted between memory cell blocks 12 and 13, 14 and 15, and 16 and 17, and between the second and third bit lines, the fourth and fifth bit lines, the sixth and seventh bit lines, the seventh and eighth bit lines.

The block 22 does not exchange the positions of the first and eighth bit lines.

The block 22 exchanges the positions of only the bit lines which are of different neighboring bit line pairs and which neighbor each other. The other blocks 24 and 26 are inserted between the memory cell blocks 14 and 15, and 16 and 17, and have structures similar to that of the block 22.

For example, in the block 22 between the memory cell blocks 12 and 13, the bit lines B1 and B4 exchange their positions, the bit lines B3 and B6 exchange their positions, the bit lines B5 and B8 exchange their positions, and the bit lines B2 and B7 do not exchange their positions.

For example, the bit line B3 neighbors the bit lines B2 and B4 in the memory cell block 11, neighbors the bit line B4 and B6 in the memory cell block 12, neighbors the bit lines B6 and B8 in the memory cell block 13, neighbors the bit lines B8 and B7 in the memory cell block 14, neighbors the bit lines B7 and B5 in the memory cell block 15, neighbors the bit line B5 and a bit line of another memory cell array, which is not shown, in the memory cell block 16, neighbors another bit line of another memory cell array, which is not shown, and the bit line B2 in the memory cell block 17, and neighbors the bit lines B1 and B2 in the memory cell block 18.

As described above, in the embodiment, the bit lines of the bit line pairs are exchanged every two memory cell blocks.

Accordingly, in the memory blocks 11 and 12, the bit line B3 neighbors the bit line B4 constituting the bit line pair B2. Therefore, when the coupling capacitance of the complementary bit lines B3 and B4 continuously neighboring through the memory cell blocks 11 to 18 is Cc, the coupling capacitance between the bit lines B3 and B4 in this embodiment is between 1/8×Cc×2 and 1/4×Cc.

The data of different electric potentials are output to the complementary bit lines B3 and B4 constituting the bit line pair BP2.

That is, the data, indicating the inverted value of the data output from the memory cell 42 to the bit line B3, is output from the memory cell 42 to the bit line B4.

This relationship between the data output to the bit line pair BP2 by selecting the memory cell is the same as those output to the bit line pairs BP1, BP3, and BP4.

Then, the word line 511 is activated, and the data stored in the memory cells 41 to 44 are output to the bit line pairs BP1, BP2, BP3, and BP4.

The coefficient "⅛" is used because, a memory cell array 10 is divided into eight sections, the bit lines are also divided into eight sections, and the capacitance therefore becomes ⅛. The coefficient "2" is used because the bit line B3 neighbors the bit line B4 in two memory blocks 11 and 12.

Similarly, the bit line B3 neighbors the bit lines B1, B2, and B5 to B8 constituting the bit line pairs BP1, BP3, and BP4 in two memory blocks. Therefore, regardless of the output from the memory cells 41, 43, and 44, the coupling capacitance between the bit line B3 and the other bit lines can be obtained by ⅛×Cc×2, and is ¼×Cc.

In addition to the bit line pair BP2 which includes the bit line B3, there are the three other bit line pairs BP1, BP3, and BP4. Therefore, the total coupling capacitance of the bit lines B3, B1, B2, and B5 to B8 can be obtained from 3×¼×Cc, and is ¾×Cc.

The bit line B3 neighbors a bit line in another memory cell array, which is not shown, in two memory cell blocks.

When the value in the bit line in the other memory cell array is different from the value in the bit line B3, the coupling capacitance between the bit line B3 and the bit line in the other memory cell array is ¼×Cc.

As the result, the total coupling capacitance CT between the bit line B3 and the neighboring bit lines is 5/4×Cc obtained by summing up the coupling capacitance ¼×Cc between the bit lines B3 and B4, the coupling capacitance ¾×Cc between the bit line B3 and the bit lines B1, B2, and B5 to B8, and the coupling capacitance ¼×Cc between the bit line B3 and the bit line in the other memory cell array.

The total coupling capacitance CT of the bit line B3 and the neighboring bit lines is 5/4×Cc. As compared with the coupling capacitance 3/2×Cc between the bit lines in the conventional twist bit line method, the loads on the bit lines are significantly decreased. Therefore, the effect of the cross talk noise between the neighboring bit lines can be reduced, and the access time for reading data from the memory cells can be shortened.

Figure 2A:
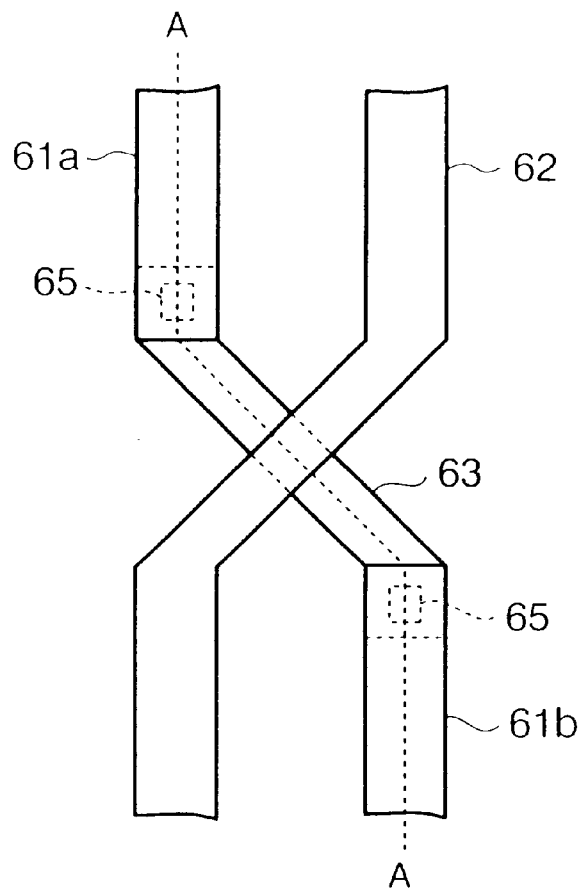
FIGS. 2A and 2B are diagrams for explaining the structure of the exchange block for exchanging the bit lines B1 and B2 in FIG. 1.
Figure 2B:
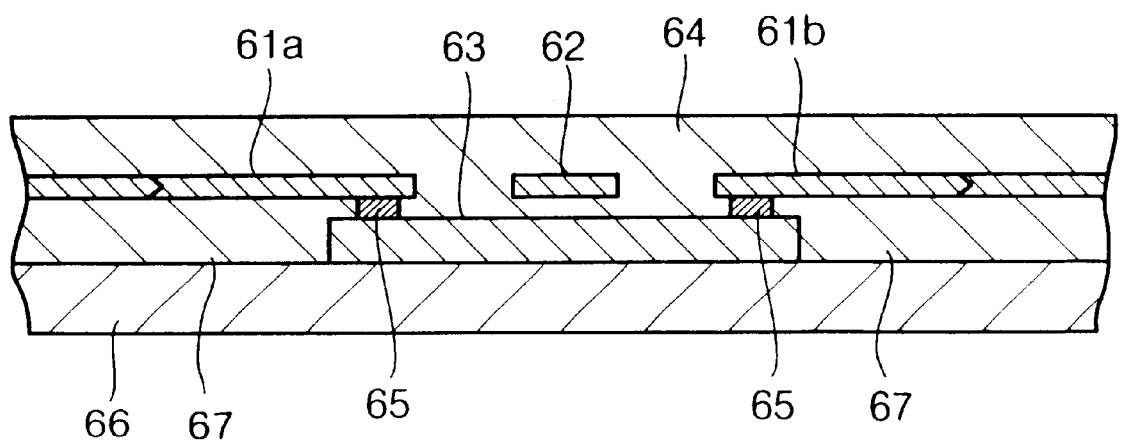

The structure of the exchange blocks 21 to 27 for exchanging the bit lines will be explained with reference to FIG. 2. FIG. 2A is an enlarged view showing the exchanging section (crossing section) of the bit lines B1 and B2 in the block 21. FIG. 2B is a diagram showing the cross section along the line A in the exchanging section of the bit lines B1 and B2 in the exchange block 21.

The exchanging section of the bit lines B3 to B8 in the other exchange blocks 21, and the exchanging sections of the bit lines in the other exchange blocks 22 to 27 have the same structure as the structure shown in FIG. 2, and their detailed description will be omitted.

In FIG. 2, connections 61a and 61b correspond to the bit line B1 (FIG. 1), and a connection 62 corresponds to the bit line B2.

At the crossing point where the positions of the bit lines B1 and B2 are exchanged, the connection 63 is formed in a connection layer separated from the connections 61a, 61b, and 62 by an insulating layer 64 so that the bit line B1 does not short-circuit with the bit line B2. The reference numerals 66 and 67 denote insulating layers.

That is, the connections 62, 61a, and 61b are formed in a second connection layer, and the connection 63n is formed in a first layer.

The connections 61a and 63 are connected by a contact 65, and the connections 63 and 61b are connected by another contact 65.

The relationship of the connection layers at the crossing point may be reversed. That is, the connections 62, 61a, and 61b may be formed in the first layer, and the connection 63 may be formed in the second layer.

In addition, three layers may be used at the cross point, and the combination of the connections may be freely designed as long as the layer of the bit line is not the same as that of the other bit line crossing over that bit line.

In the above description, the bit lines constituting the bit line pair are formed in the same connection layer (single layer). The bit lines may be formed by multi-layer connections using a plurality of connection layers. In this case, the bit lines are formed in different connection layers in a fashion similar to the arrangement of the connection layers at the crossing point as long as the different bit lines do not short-circuit at the crossing point.

Figure 3:
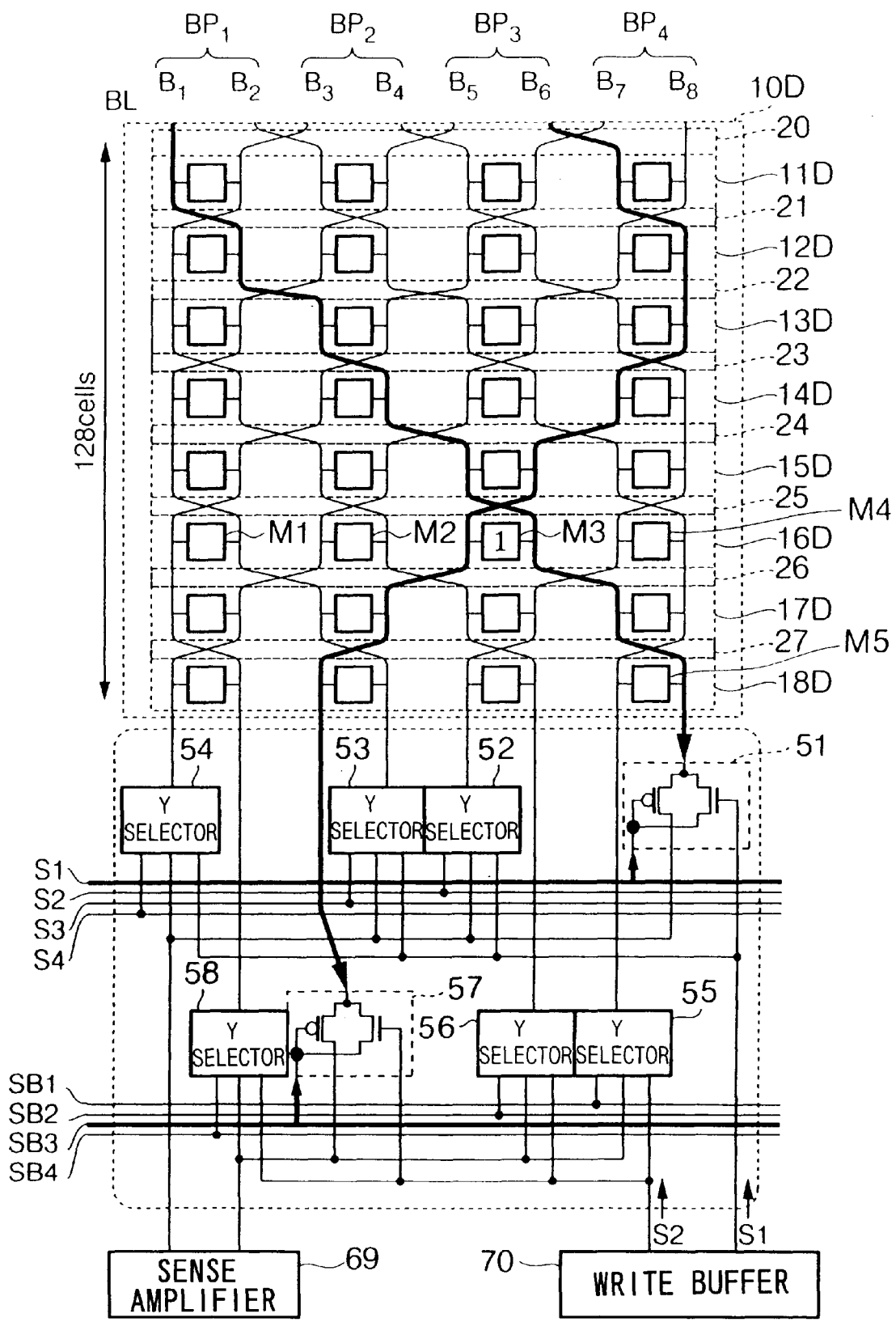
FIG. 3 is a block diagram showing the structure of the semiconductor memory device of the present invention.

The operation of the embodiment will be explained with reference to FIGS. 3 and 4. FIG. 3 is a block diagram showing the semiconductor memory device of the embodiment. FIG. 3 shows a memory cell array 10D. To easily explain the memory cell array 10D, the memory cell array 10 is simplified by reducing the number of the memory cells, and only one memory cell is shown in each memory cell block (sixteen memory cells are actually provided for each bit line pair in one memory cell block). Further, FIG. 3 shows sense amplifiers for determining the data read from the memory cells.

The memory cell array 10D is divided into eight memory cell blocks 11D to 18D (one memory cell block actually has sixteen rows of memory cells).

FIG. 4 is a truth table showing the relationship between the data values of address signals in the decoding process by Y decoders (not shown) and the data values of selection lines S1 to S4 and SB1 to SB4 for controlling Y selectors.

In FIG. 4, the address {Y1, Y0} indicating a column in a memory cell M1 is {1, 1}. The address {Y1, Y0} indicating a column in a memory cell M2 is {1, 0}. The address {Y1, Y0} indicating a column in a memory cell M3 is {0, 1}. The address {Y1, Y0} indicating a column in a memory cell M4 is {0, 0}. The address {X1, X0} indicating the memory cell blocks 11D and 12D is {1, 1}. The address {X1, X0} indicating the memory cell blocks 13D and 14D is {1, 0}. The address {X1, X0} indicating the memory cell blocks 15D and 16D is {1, 0}. The address {X1, X0} indicating the memory cell blocks 17D and 18D is {0, 0}.

Since the combinations of the bit lines constituting the bit line pairs in the respective memory cell blocks are different, the Y decoders can logically select (turn on) the Y selector connected to the bit lines of the bit line pair in the selected memory cell.

For example, the bit line pair in the selected memory cell M3 is constituted by the bit lines B1 and B6.

In FIG. 3, the exchange block 20 is inserted to exchange the positions of the bit lines in order to adjust the truth table of FIG. 4.

The exchange block 20 exchanges the bit line B2 with the bit line B3, exchanges the bit line B4 with the bit line B5, and exchanges the bit line B6 with the bit line B7. Then, the exchange block 21 exchanges the bit line B1 with the bit line B3, exchanges the bit line B2 with the bit line B5, exchanges the bit line B1 with the bit line B3, and exchanges the bit line B6 with the bit line B8. The crossing points of the bit lines in the exchange block 20 in FIG. 3 have the structure shown in FIG. 2. The crossing points in the exchange blocks 21 to 27 inserted between the memory cell blocks have the structure shown in FIG. 2.

In the bit line pair BP4, the data TRUE is output from the memory cell M5 (the cell in the block 18D at the right bottom), and the data FALSE to which the data on the bit line B1 is inverted is output to the bit line B2.

The bit line B1 constitutes a pair with the bit line B6 in the memory cell block 15D, constitutes a pair with the bit line B7 in the memory cell blocks 14D and 13D, and constitutes a pair with the bit line B3 in the memory cell blocks 12D and 11D.

Similarly, the bit line B2 constitutes a pair with the bit line B4 in the memory cell block 15D, constitutes a pair with the bit line B8 in the memory cell blocks 14D and 13D, and constitutes a pair with the bit line B5 in the memory cell blocks 12D and 11D.

Reference numerals 51 to 54 denote Y selectors for connecting one of the bit lines B1, B4, B5, and B8, which constitute a pair with the bit line B2, to the sense amplifier 69.

Reference numerals 55 to 58 denote Y selectors for connecting one of the bit lines B2, B3, B6, and B7, which constitute a pair with the bit line B1, to the sense amplifier 69.

As described above, when forming the bit line pairs, the bit lines B2, B3, B6, and B7 outputs the data TRUE, and the bit lines B1, B4, B5, and B8 outputs the data FALSE. The respective memory cells have pairs of the bit lines of TRUE and FALSE (symmetrical with respect to the bit lines of TRUE and FALSE), and use these bit lines for outputting the data TRUE and FALSE.

The structure of the Y selectors 51 to 58 is the same as described above, and comprises a p-channel transistor and an n-channel transistor in a fashion similar to the Y selectors 51 and 57.

For example, when reading the data stored in the memory cell M3 in the memory cell block 16D, a word line not shown is activated so that the memory cells M1 to M4 are selected. To read the data stored in these memory cells, a write buffer 70 outputs write control signals S1 and S2 at the L level to turn off the n-channel transistors in the Y selectors 51 to 58.

Then, to select the bit line B1 to which the data TRUE is to be read from the memory cell M3 and the bit line B6 to which the data FALSE is to be read from the memory cell M3, the Y decoder not shown changes the selection lines S1 and SB3 from the H level to the L level (activates the selection lines) based on the combination of the addresses {Y1, Y0} and {X1, X0} in the area R in the truth table of FIG. 4. At that time, the addresses input to the Y decoder are {Y1, Y0}={0, 1} and {X1, X0}={0, 1}.

The Y decoder maintains the selection lines S2 to S4, SB1, SB2, and SB4 at the H level.

That is, since the positions of the bit lines are changed, the selection lines for turning on or off the Y selectors corresponding to the bit line pairs are activated in the memory cell blocks with the memory cell from which the data is to be read, based on not only the address {Y1, Y0} for selecting the bit lines but also the address {X1, X0} indicating the positions of the bit lines with respect to the direction of the word lines.

By activating the selection lines S1 and SB3, the Y selector is turned on, that is, the p-channel transistor in the Y selector 51 is turned on. Therefore, the data TRUE read from the memory cell M3 to the bit line B1 is supplied to the sense amplifier 69. Similarly, by activating the selection lines S1 and SB3, the Y selector 57 is turned on, that is, the p-channel transistor in the Y selector 57 is turned on. Therefore, the data FALSE read from the memory cell M3 to the bit line B6 is supplied to the sense amplifier 69.

Thus, the sense amplifier 69 amplifies the potential difference between the data TRUE and FALSE output from the memory cell M3, and determines whether the stored data is 1 or 0.

According to the present invention, when amplifying the potential difference between the data TRUE and FALSE, the total coupling capacitance between the neighboring bit lines is decreased from 3/2×Cc, which is provided by the conventional twist bit line method, to 5/4×Cc. Therefore, the effect of cross talk noise due to variations of the data (signal) in the neighboring bit lines is reduced, and the correct result of amplification can be obtained faster than with the conventional technique.

Further, the write operation to the SRAM discharges one of the selected bit line pairs to a low electric potential, and charges the other bit line to a high electric potential. For example, the operation for writing data 1 into the memory cell M3 will be explained.

First, a write driver 70 changes the control signals S1 and S2 from the H level to the L level.

Then, the Y decoder, not shown, outputs the data TRUE (e.g., with a high electric potential), which corresponds to the data 1 to be written, to the selection line S1, and outputs the data FALSE (e.g., with a low electric potential), which corresponds to the data 1 to be written, to the selection line SB3. Thus, the n-channel transistors in the Y selectors 51 to 58 are turned on, the bit line B1 is charged by the Y selector 51, the bit line B6 is discharged by the Y selector 57, so that the data 1 is written into the memory cell M3. The other selection lines S2 to S4, SB1, SB2, and SB4 are maintained at a high electric potential in order to prevent the loss (or, change) of the data stored in the memory cells.

Figure 5:
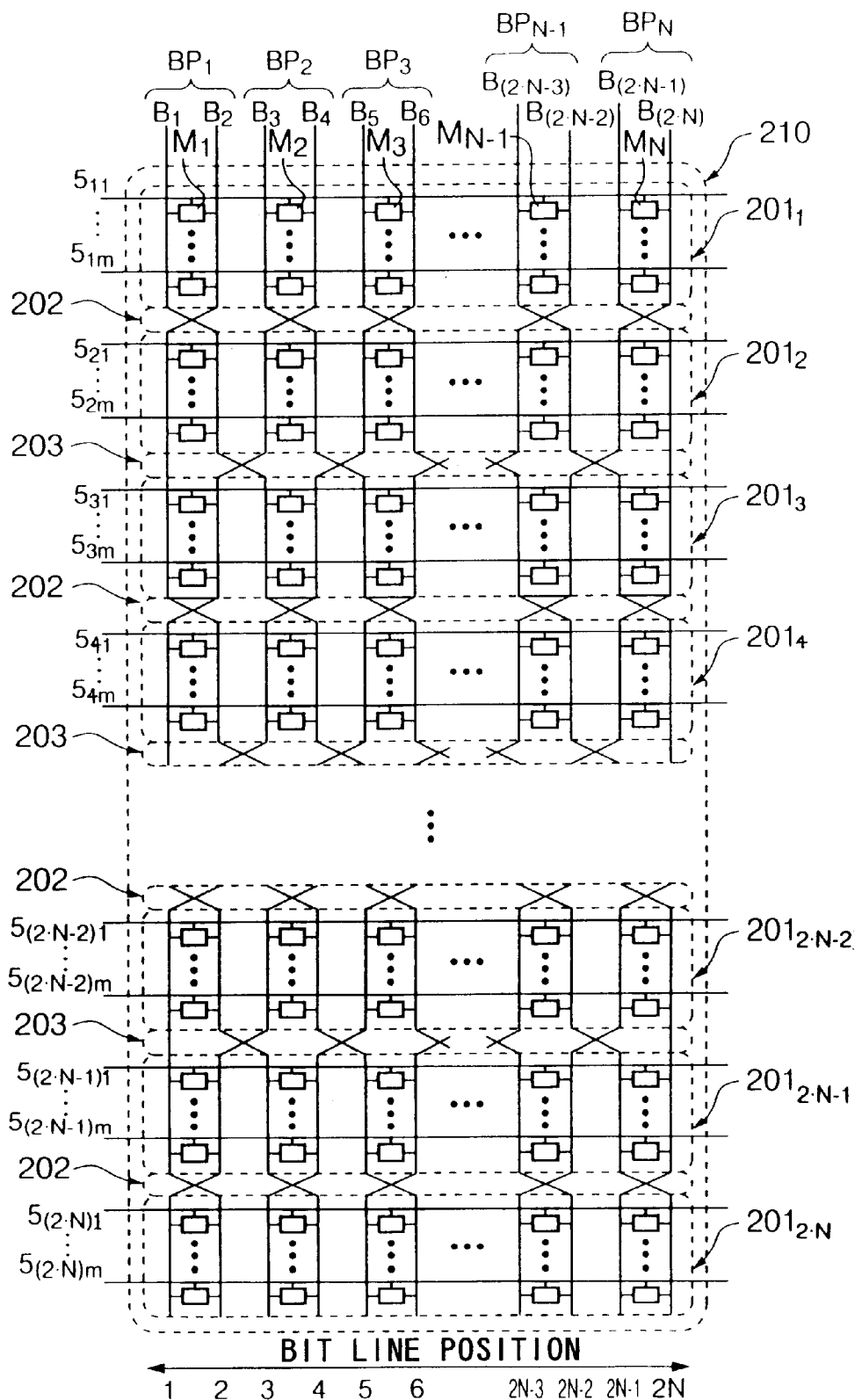
FIG. 5 is a schematic diagram showing the memory cell array to which the structure of FIG. 1 is applied.

As shown in FIG. 5, another embodiment of the present invention may have 2×N bit lines, whose positions are exchanged, and to which N number of SRAM cells with respect to the word line direction output data (N is an integer of 2 or more). FIG. 5 is a schematic diagram showing the structure of the memory cell array with the N number of bit line pairs which is the modification of the structure of the memory cell array of FIG. 1.

In FIG. 5, a memory cell array 210 comprises a memory cell column starting from a memory cell M1 connected to a bit line pair BP1, a memory cell column starting from a memory cell M2 connected to a bit line pair BP2, a memory cell column starting from a memory cell M3 connected to a bit line pair BP3, . . . , a memory cell column starting from a memory cell M(N−1) connected to a bit line pair BP(N−1), and a memory cell column starting from a memory cell MN connected to a bit line pair BPN.

In memory cell blocks 2011 and 2012, the bit line pair BP1 comprises bit lines B1 and B2, the bit line pair BP2 comprises bit lines B3 and B4, the bit line pair BP3 comprises bit lines B1 and B2, . . . , the bit line pair BP(N−1) comprises bit lines B(2×N−1) and B(2×N−2), and the bit line pair BPN comprises bit lines B(2×N−1) and B(2×N). A word line 511 is connected to the memory cells M1 to MN. The other word lines 512 to 5(2×N)M are connected to the corresponding memory cells in the respective memory cell blocks.

In memory cell blocks 2013 to 2014, the bit line pair BP1 comprises the bit lines B2 and B4, the bit line pair BP2 comprises the bit lines B1 and B6, the bit line pair BP3 comprises the bit lines B3 and B8, . . . , the bit line pair BP(N×1) comprises the bit lines B(2×N−5) and B(2×N), and the bit line pair BPN comprises the bit lines B(2×N−3) and B(2×N−1).

As described above, the combinations of the bit lines constituting the bit line pairs in the respective memory cell blocks differ from each other.

When the memory cell M2 outputs the data TRUE to the bit line B3, the data FALSE is output to the bit line B4.

In this case, since the bit line B4 constitutes the bit line pair BP1 with the bit line B2 in the memory cell block 2013, the data TRUE is output to the bit line B2.

Since the bit line B1 constitutes the bit line pair BP1 with the bit line B1 in the memory cell block 2011, the data FALSE is output to the bit line B1.

In the following blocks, the memory cells output the data TRUE to the bit lines which constitute the bit line pair with the bit line B4, and the memory cells outputs the data FALSE to the bit lines which constitute the bit line pair with the bit line B3.

That is, in a manner similar to that described with reference to FIG. 3, the bit lines B1 to B(2×N) are divided into a bit line group to which the memory cells outputs the data TRUE and a bit line group to which the memory cells output the data FALSE with respect to a sense amplifier for determining the data, and the groups are connected through Y selectors.

Further, the memory cell array 210 is equally divided into 2×N blocks which are the memory cell blocks 2011 to 201(2×N) so as to have the same number of the word lines with respect to the bit line direction. The number 2×N is the same as the number of the bit lines in the memory cell array 201. In the respective memory cell blocks, the word lines are connected to the memory cells aligned in the row direction. For example, in the memory cell block 2011, the word lines 510 to 51m (m is an integer) extending in the row direction are connected to the memory cells in the respective columns.

Exchange blocks 202 for exchanging the positions of the bit lines constituting the bit line pairs (exchanging the electrical connections of the bit lines) are inserted between the memory cell blocks 201l and 2012, between the memory cell blocks 2013 and 2014, ..., between the memory cell blocks 201(2×N−1) and 201(2×N). The exchange blocks 202 have a similar structure to those of the exchange blocks 23, 25, and 27.

For example, the exchange block 202 between the memory cell blocks 201l and 2012 exchanges the positions of the bit lines B1 and B2 of the bit line pair BP1, ..., the bit lines B(2×N−1) and B(2−N) of the bit line pair BPN.

Similarly, exchange blocks 203 for exchanging the positions of the neighboring bit lines of the neighboring bit line pairs (exchanging the electrical connections of the bit lines) are inserted between the memory cell blocks 2012 and 2013, ..., between the memory cell blocks 201(2×N−2) and 201(2×N−1). The exchange blocks 203 have a similar structure to those of the exchange blocks 22, 24, and 26.

For example, the exchange block 203 exchanges the positions of the bit line B1 of the bit line pair BP1 and the bit line B4, ..., and the bit line B(2×N−3) of the bit line pair BPN and the bit line B(2×N), and does not exchange the bit lines B2 and B(2×N−1) at both ends of the memory cell array 210.

In the memory cell block 2012N, the bit line B1 moves to the (2× N)-th position from the left of FIG. 5 (see the positions of the bit lines indicated at the bottom of FIG. 5), the bit line B2 moves to the (2×N−2)-th position, the bit line B3 moves to the (2×N−1)-th position, ..., and the bit line B(2×N) moves to the first position.

Figure 7:
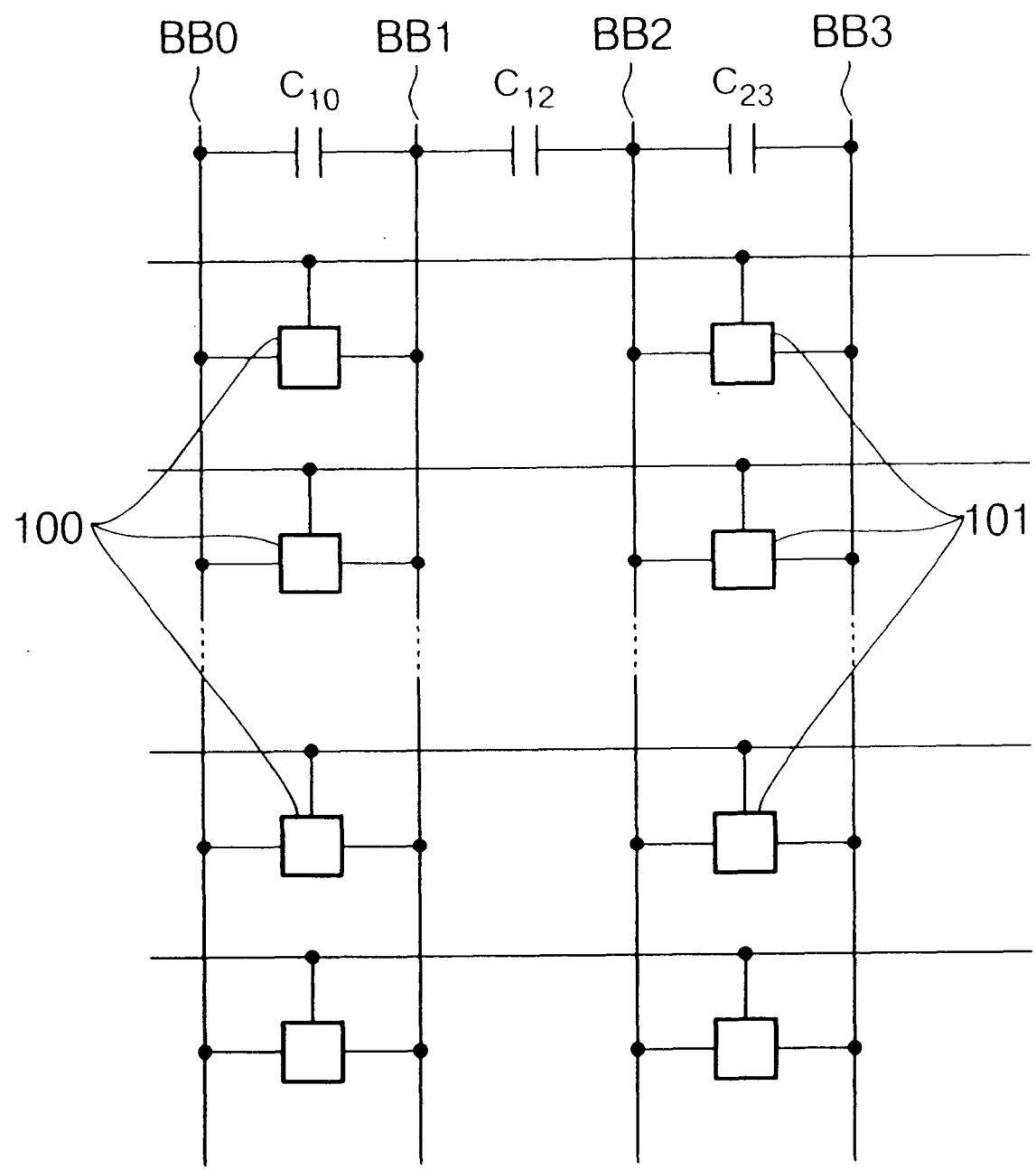
FIG. 7 is a schematic diagram showing the arrangement of the bit lines and the memory cells of the conventional semiconductor memory device.
Figure 8:
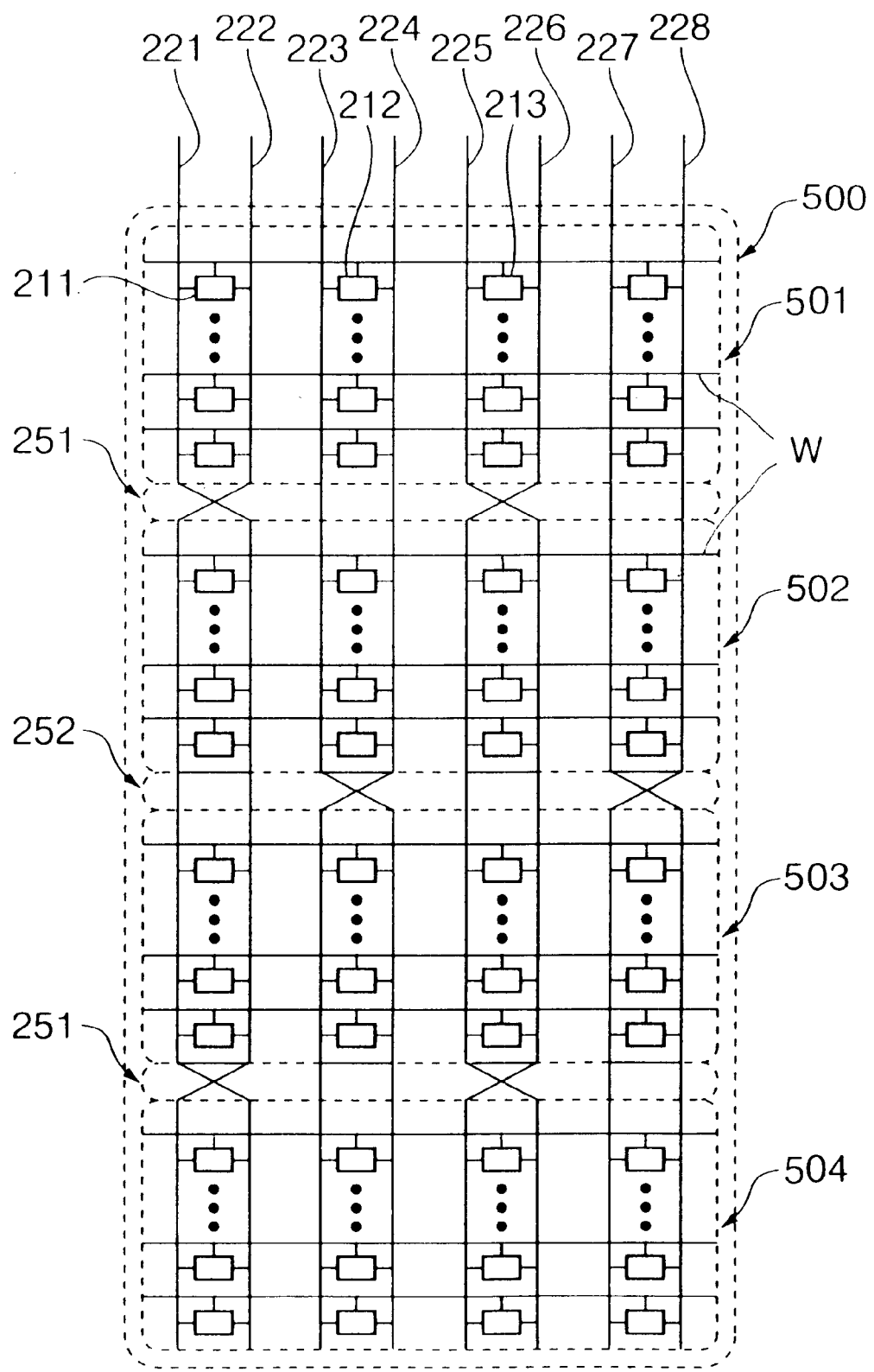
FIG. 8 is a schematic diagram showing the twisting structure of the bit lines and the memory cells of the conventional semiconductor memory device.

By exchanging the positions of the bit lines, each of 2×N bit line lines in the memory cell array 210 neighbors the other 2×N−1 bit lines. In the semiconductor memory device of the present invention shown in FIGS. 1 and 2, one bit line crosses the other bit line in the exchange blocks 21 to 27, 202, and 203 for exchanging the bit lines between the blocks in a fashion similar to the crossing sections 802 and 803 in the twist bit line method for the conventional SRAM shown in FIG. 7. The structure of the crossing sections for exchanging the bit lines is shown in FIG. 2. For example, the bit line B1 corresponds to connections 61a and 61b, and the bit line B2 corresponds to a connection 62.

When the memory cell array 210 has N bit line pairs, the coupling capacitance of each of the neighboring bit lines is (N+1)/N×Cc. From the memory cell blocks 201l to 2012N, the integrated capacitance of each of the neighboring bit lines in the memory cell array 210 is ((2/2N)×Cc+(2(N−1)/2N)×Cc, and the coupling capacitance with the bit lines in the other memory cell array is (2/2N)×Cc. Therefore, the total coupling capacitance is ((2N/2N)×Cc+(2/2N)×Cc((N+1)/N×Cc.

The member "(2/2N)×Cc" is the coupling capacitance with the bit line of the bit line pair in the memory cell to be read, and the member "2(N−1)/2N)×Cc" is the coupling capacitance with the other bit lines which do not constitute the bit line pair of the memory cell to be read.

Thus, as the number N of the bit line pairs is increased, the total coupling capacitance of each of the neighboring bit lines can be brought close to Cc.

While the embodiments of the present invention are described in detail with reference to the drawings, the structure of the present invention is not limited to this, and modifications without departing from the spirit thereof are included in the scope of the invention.

Figure 6:
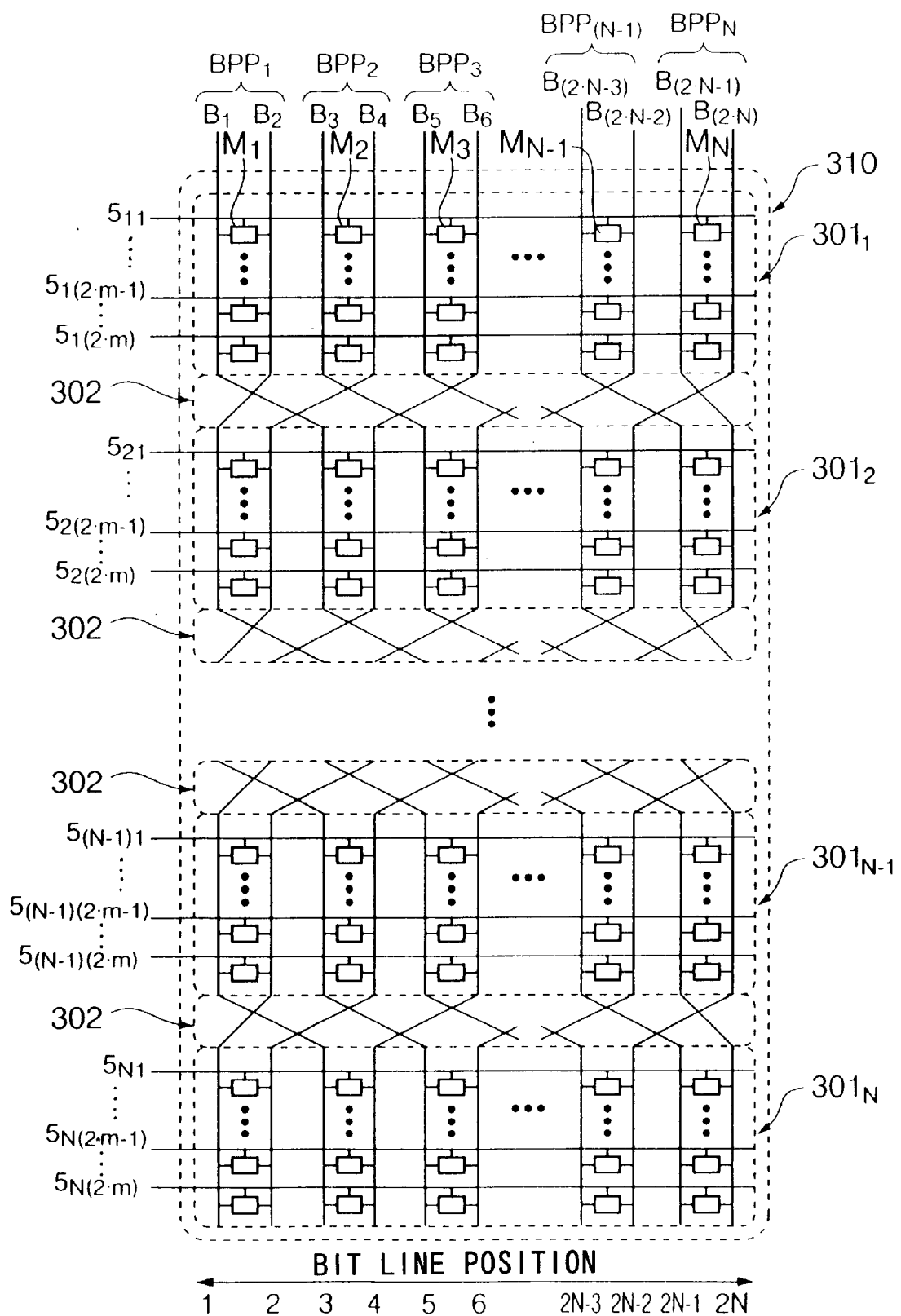
FIG. 6 is a schematic diagrams showing the arrangement of the bit lines and the memory cells of the second embodiment of the present invention.

For example, as shown in FIG. 6, the number of the memory cell blocks into which the memory cell array B10 is divided can be the same as the number of the bit line pairs. FIG. 6 is a schematic diagram showing the arrangement of the bit lines in the memory of the SRAM which is the second embodiment of the present invention. To easily compare the second embodiment with the above-described first embodiment, the number of the memory cells in the second embodiment is the same as that in the first embodiment.

In FIG. 6, the memory cell array B10 comprises a memory cell column starting from a memory cell M1 connected to a bit line pair BPP1, a memory cell array starting from a memory cell M2 connected to a bit line pair BPP2, a memory cell array starting from a memory cell M3 connected to a bit line pair BPP3, ..., a memory cell array starting from a memory cell M(N−1) connected to a bit line pair BPP(N−1), and a memory cell array starting from a memory cell MN connected to a bit line pair BPPN. A word line 51l is connected to the memory cells M1 to MN. The other word lines 5l2 to 5N(2m) are connected to the memory cells in the respective memory cell blocks.

In the memory cell block 301l, the bit line pair BPP1 comprises the bit lines B1 and B2, the bit line pair BPP2 comprises the bit lines B3 and B4, the bit line pair BPP3 comprises the bit lines B5 and B6, ..., and the bit line pair BPP(N−1) comprises the bit lines B(2×(N−1) and B(2×N).

In the memory cell block 3012, the bit line pair BPP1 comprises the bit lines B2 and B4, the bit line pair BPP2 comprises the bit lines Bi and B6, the bit line pair BPP3 comprises the bit lines B3 and B8, ..., the bit line pair BP(N−1) comprises the bit lines B(2×(N−5) and B(2×N), and the bit line pair BPN comprises the bit lines B(2×(N−3) and B(2×(N−1)).

Thus, the combinations of the bit lines constituting the bit line pairs differ in the respective memory cell blocks.

When the number of the bit lines whose positions are exchanged is 2×N (N is an integer which is 2 or more) corresponding to N memory cells M1 to MN in the SRAM, the memory cell array 310 is equally divided into N blocks which are the memory cell blocks 301l to 301N so as to have the same number of the word lines with respect to the bit line direction. In the respective memory cell blocks, the word lines are connected to the memory cells aligned in the row direction. For example, in the memory cell block 301l, the word lines 51l to 51(2m) (m is an integer) extending in the row direction are connected to the memory cells M1, M2, M3, and M4in the respective columns.

Exchange blocks 302 for exchanging the positions of the bit lines according to the method which will be described below are inserted between the neighboring memory cell blocks 301l and 301N.

The exchange block 302 moves the first bit line from the left in the figure (see the positions indicated at the bottom of the figure) to the third position, moves the second bit line to the first position, moves the third bit line to the fifth position, moves the fourth bit line to the second position, moves the fifth bit line to the seventh position, moves the sixth bit line to the fourth position, ..., moves the (2N−1)-th bit line to the 2N-th position, and moves the 2N-th bit line to the (2N−2)-th position. Thus, the positions of the bit lines are changed.

That is, the bits, other than the second bit from the left in the figure which is moved to the first position and the (2N−1)-th bit which is moved to the 2N-th position, are shifted by two bits of the bit lines in the left direction.

Except for the second bit from the left in the figure which is moved to the first position and for the (2N−1)-th bit which is moved to the 2N-th position, each bit line crosses other two bit lines at the crossing sections. The structure of the crossing sections is similar to that in the embodiment shown in FIG. 2.

Thus, 2×N bit lines equally neighbor the other 2×N−1 bit lines.

As described above, in the second embodiment, the bit lines constituting the bit line pairs are changed in the respective memory cell blocks.

Accordingly, when the memory cell array 210 has N bit line pairs, the coupling capacitance of each of neighboring bit lines is ((N+1)/N)×Cc. As the number N of the bit line pairs is increased, the total coupling capacitance of each of the neighboring bit lines can be brought close to Cc.

The total coupling capacitance of each bit is the same as that of the first embodiment. The reason for this is that the number of the memory cell blocks is ½ of that of the first embodiment, and that the number of combination changes is twice because the second embodiment changes the combinations of the bit lines constituting the bit line pairs in the respective memory cell blocks while the first embodiment does not change the combinations of the bit lines constituting the bit line pairs within two memory cell blocks. As the result, the ratio of the capacitance of the first embodiment to that of the second embodiment is 2×(½)=1.

When in the memory cell array the number of the bit line pairs is the same as that of the memory cells, the structures of the Y decoder and the Y selector which are described in the first embodiment may be used in the second embodiment.

That is, in a manner similar to that described with reference to FIG. 3, the bit lines B1 to B(2×N) are divided into a bit line group to which the memory cells outputs the data TRUE and a bit line group to which the memory cells output the data FALSE with respect to a sense amplifier for determining the data, and the groups are connected through the Y selectors.

As described above, according to the semiconductor memory devices of the first and second embodiments of the present invention, the memory cell array 10 (210, or 310) is divided into a plurality of the memory cell blocks 11 to 18 (2011 to 201N, or 3011 to 301N), and the exchange blocks 21 to 27 for exchanging the positions of the bit lines of the bit line pairs are inserted between the memory cell blocks 11 to 18 (2011 to 201N, or 3011 to 301N), and exchanges the positions of the bit lines of the same bit line pair and of the different neighboring bit line pairs.

Thus, the bit lines equally neighbor all the other bit lines. Therefore, regardless of the data values read from the memory cells to the bit line pairs, the total coupling capacitance between the neighboring bit lines is the average between the total coupling capacitance in the best data conditions of the neighboring bit lines and the total coupling capacitance in the worst condition, decreasing the cross-talk noise in the bit lines, and shortening the access time in the reading operation.

While the present invention is described by way of the first and second embodiments, the exchange blocks in the memory cell arrays 210 and 310 may be combined so that the memory cell array may have a different number of the memory cell blocks.

The structures of the first and second embodiments may not only exchange the positions of the bit lines of the semiconductor memory device, but may be also employed in a data bus for transferring a plurality of signals.

That is, the data bus is divided into a plurality of blocks in the signal transfer direction, and the exchange blocks 202 and 203, the exchange block 302, or the exchange blocks 202, 203, and 302 are inserted between the blocks. Since this modification can decrease the coupling capacitance of the neighboring signal lines in the data bus in a manner similar to the first and second embodiments, the cross-talk noise between the connections can be decreased, and the data transfer rate can be increased.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A semiconductor memory device comprising:
   memory cells arranged in a matrix;
   word lines extending in a first direction;
   bit line pairs extending in a second direction, perpendicular to said first direction;
   exchange blocks for exchanging the bit lines of different bit line pairs; and
   a plurality of memory cell blocks each of which has a predetermined number of the memory cells, and which are aligned in the second direction, wherein the respective exchange blocks are positioned between the memory cell blocks; and
   wherein first exchange blocks exchange the bit lines of the different bit line pairs, and second exchange blocks exchange bit lines constituting the same bit line pairs, wherein the first and second exchange blocks are arranged alternately.

2. A semiconductor memory device according to claim 1 wherein the exchange blocks exchange the positions of the bit lines in the respective memory cell blocks so that each bit line neighbors the other bit lines only once in one of the memory cell blocks.

3. A semiconductor memory device according to claim 1 further comprising: a first connection layer for forming the bit lines; and a second connection layer for exchanging the bit lines at the exchange blocks.

4. A semiconductor memory device according to claim 3 wherein each bit line layer crosses one bit line at the exchange block.

5. A semiconductor memory device according to claim 3 wherein each bit line layer crosses two bit lines at the exchange block.

6. A semiconductor memory device according to claim 1 wherein the respective bit line pairs are formed in the same connection layer outside the exchange blocks.

7. A semiconductor memory device according to claim 1 wherein the respective bit line pairs are formed in a plurality of connection layers outside the exchange blocks.

8. A semiconductor memory device according to claim 1, wherein when a coupling capacitance between complimentary bit lines of a bit line pair continuously neighboring through the memory cells is Cc, the exchange blocks exchange bit lines such that the total coupling capacitance between a bit line and neighboring bit lines is 5/4 Cc.

9. A semiconductor memory device according to claim 1, wherein when a coupling capacitance between complimentary bit lines of a bit line pair continuously neighboring through the memory cells is Cc and the total number of bit lines pairs is N, the coupling capacitance of each of the bit lines is $(N+1)/N \times Cc$.

10. In a semiconductor memory device including memory cells arranged in a matrix, and bit line pairs, a method comprising:

forming memory cell blocks including at least a first, second and third memory cell block, each memory cell block having a predetermined number of the memory cells, and exchanging bit lines of different bit line pairs between said first memory cell block and said second memory cell block, and exchanging bit lines constituting the same bit line pairs between said second cell memory block and said third cell memory block.

11. The method of claim 10, further comprising forming of at least a fourth and a fifth memory cell block; and exchanging bit lines of different bit line pairs between said third memory cell block and said fourth memory cell block, and exchanging bit lines constituting the same bit line airs between said fourth cell memory block and said fifth cell memory block.

12. A semiconductor memory device comprising:

memory cells arranged in a matrix;

word lines extending in a first direction;

bit line pairs extending in a second direction, perpendicular to said first direction;

exchange blocks for exchanging the bit lines of different bit line pairs; and a first connection layer for forming the bit lines; and a second connection layer for exchanging the bit lines at the exchange blocks.

13. A semiconductor memory device according to claim 12 further comprising: memory cell blocks each of which has a predetermined number of the memory cells, and which are aligned in the second direction, wherein the respective exchange blocks are positioned between the memory cell blocks.

14. A semiconductor memory device according to claim 13 wherein first exchange blocks exchange the bit lines of the different bit line pairs, and second exchange blocks exchange bit lines constituting the same bit line pairs, wherein the first and second exchange blocks are arranged alternately.

15. A semiconductor memory device comprising:

memory cells arranged in a matrix;

word lines extending in a first direction;

bit line pairs extending in a second direction, perpendicular to said first direction;

exchange blocks for exchanging the bit lines of different bit line pairs; and wherein the respective bit line pairs are formed in the same connection layer outside the exchange blocks.

16. A semiconductor memory device according to claim 15 further comprising: memory cell blocks each of which has a predetermined number of the memory cells, and which are aligned in the second direction, wherein the respective exchange blocks are positioned between the memory cell blocks.

17. A semiconductor memory device according to claim 16 wherein first exchange blocks exchange the bit lines of the different bit line pairs, and second exchange blocks exchange bit lines constituting the same bit line pairs, wherein the first and second exchange blocks are arranged alternately.

18. A semiconductor memory device comprising:

memory cells arranged in a matrix;

word lines extending in a one direction;

bit line pairs extending in a second direction, perpendicular to said first direction;

exchange blocks for exchanging the bit lines of different bit line pairs; and wherein the respective bit line pairs are formed in a plurality of connection layers outside the exchange blocks.

19. A semiconductor memory device according to claim 18 further comprising: memory cell blocks each of which has a predetermined number of the memory cells, and which are aligned in the second direction, wherein the respective exchange blocks are positioned between the memory cell blocks.

20. A semiconductor memory device according to claim 19 wherein first exchange blocks exchange the bit lines of the different bit line pairs, and second exchange blocks exchange bit lines constituting the same bit line pairs, wherein the first and second exchange blocks are arranged alternately.

* * * * *